(12) United States Patent
Lee

(10) Patent No.: US 6,558,985 B2
(45) Date of Patent: May 6, 2003

(54) CHARGE COUPLED DEVICE AND METHOD OF FABRICATING THE SAME

(75) Inventor: Seo Kyu Lee, Chungcheongbuk-do (KR)

(73) Assignee: LG Semicon Co., Ltd., Chungcheongbuk-do (KR)

(*) Notice: Subject to any disclaimer, the term of this patent is extended or adjusted under 35 U.S.C. 154(b) by 0 days.

(21) Appl. No.: 10/086,520

(22) Filed: Mar. 4, 2002

(65) Prior Publication Data

US 2002/0094630 A1 Jul. 18, 2002

Related U.S. Application Data

(62) Division of application No. 09/222,679, filed on Dec. 29, 1998, now Pat. No. 6,383,834.

(30) Foreign Application Priority Data

Dec. 30, 1997 (KR) ............................................. 97-79133

(51) Int. Cl.[7] .............................................. H01L 27/14
(52) U.S. Cl. ....................................... 438/145; 438/593
(58) Field of Search ................................ 438/145, 593, 438/FOR 137, FOR 210, FOR 213

(56) References Cited

U.S. PATENT DOCUMENTS 4,387,354 A 6/1983 Angle
5,463,232 A * 10/1995 Yamashita et al. .......... 257/223
6,306,676 B1 * 10/2001 Stevens et al. ................ 438/48

OTHER PUBLICATIONS

Tamaguchi et al., "A ⅓–inch 330k Square–Pixel Progressive–Scan IT–CCD," IEEE Workshop on CCD and AIS, 1995.

* cited by examiner

Primary Examiner—George Fourson
(74) Attorney, Agent, or Firm—Birch, Stewart, Kolasch & Birch, LLP

(57) ABSTRACT

A CCD and method of fabricating the same, which reads signal charges completely and increases the fill factor of its pixel, to improve the sensitivity. The CCD having photodiodes in matrix form, includes a first interlevel insulating layer and first transfer gate sequentially formed between the photodiodes arranged in the row direction, a block insulating layer formed along the center of the first transfer gate, a second interlevel insulating layer formed on the first transfer gate, second and third transfer gates formed on the first transfer gate, being isolated from each other on the block insulating layer, a third interlevel insulating layer formed on the second and third transfer gates, and a fourth transfer gate formed on the third interlevel insulating layer, being placed on the second and third transfer gates.

15 Claims, 11 Drawing Sheets

CHARGE COUPLED DEVICE AND METHOD OF FABRICATING THE SAME

This application is a divisional of application Ser. No. 09/222,679, filed on Dec. 29, 1998, now U.S. Pat. No. 6,383,834 the entire contents of which are hereby incorporated by reference and for which priority is claimed under 35 U.S.C. §120; and this application claims priority of Application Ser. No. 97-79133, filed in Korea on Dec. 30, 1997 under 35 U.S.C. §119.

BACKGROUND OF THE INVENTION

1. Field of the Invention

The present invention relates to a charge coupled device (CCD) and, more particularly, to a CCD and method of fabricating the same, which reads signal charges completely and increases the fill factor of its pixel, to improve the sensitivity.

2. Discussion of Related Art

A conventional CCD is constructed in such a manner that photodiodes are arranged in matrix form, and vertical charge coupled devices (VCCDs) receiving charges accumulated in the photodiodes and transmitting them to horizontal charge coupled devices (HCCDs) are formed in a row between the photodiodes. At present, a 4-phase VCCD using triple polysilicon layers is employed to the vertical charge transfer region of quarter-inch three hundreds thirty thousands pixels of progressive scan CCD (PS-CCD). A conventional CCD having the 4-phase VCCD structure using the triple polysilicon layers and method of fabricating the same are explained below with reference to the attached drawings. FIG. 1 is a plan view of the conventional 4-phase CCD using the triple polysilicon layers, FIG. 2A is a cross-sectional view of the conventional CCD, taken along line I—I of FIG. 1, FIG. 2B is a cross-sectional view of the conventional CCD, taken along line II—II of FIG. 1, and FIG. 2C is a cross-sectional view of the conventional CCD, taken along line III—III of FIG. 1. FIG. 3 show readout clocks of the conventional CCD, and FIGS. 4A to 4D are cross-sectional views showing a method of fabricating the conventional CCD.

The prior art realized by the aforementioned conventional CCD is about transfer gates constructing the VCCD, which transmit charges accumulated in the photodiodes to the HCCD. Referring to FIGS. 1, 2A, 2B and 2C, the conventional CCD is constructed in such a manner that a P-well 2 is formed in an N-type semiconductor substrate 1 to a predetermined depth, and a buried charge coupled device (BCCD) 3 is formed in P-well 2 in the direction of VCCD. First transfer gates 7 formed of a first polysilicon layer are formed in parallel on BCCD 3 and between photodiodes 4 in the row direction, having a specific interval. Second and third transfer gates 10a and 10b are superposed on both edges of first transfer gate 7 in the region between photodiodes 4 in the row direction and a region where the VCCD is formed, and also arranged on edges of photodiodes 4 in parallel. A fourth transfer gate 13a is formed on first transfer gate 7 between photodiodes 4, and partially superposed on second transfer gate 10a, third transfer gate 10b, BCCD 3 and neighboring another second transfer gate 10c in the VCCD region.

A method of fabricating first, second, third and fourth transfer gates 7, 10a, 10b and 13a formed between photodiodes 4 arranged in the row direction is described below. Referring to FIG. 4A, P-type ions are implanted into N-type semiconductor substrate 1 and thermal diffusion is carried out, to form P-well 2 in semiconductor substrate 1 to a predetermined depth. A pattern for forming photodiode 4 is formed on P-well 2, and N-type impurity ions are implanted into P-well 2 to a predetermined depth, to form a plurality of photodiodes 4 in matrix form. Then, a P-type channel stop region 5 is formed in a portion of P-well 2, placed between photodiodes 4, so as to come into contact with one side of each of photodiodes 4 adjacent to each other in the row direction. A first interlevel oxide layer 6 is formed on the overall surface of the substrate thinly, and a first polysilicon layer is formed thereon. First polysilicon layer is anisotropic-etched, to be left on channel stop region 5 placed between photodiodes 4 arranged in the row direction and on the VCCD region, forming first transfer gate 7.

Referring to FIG. 4B, an oxide layer is deposited through chemical vapor deposition (CVD) and anisotropic-etched, to be left on the center of first transfer gate 7, forming a block oxide layer 8. A second interlevel oxide layer 9 and second polysilicon layer 10 are formed on first transfer gate 7. A photoresist 11 is coated on second polysilicon layer 10, and then selectively exposed and developed, to be patterned. Referring to FIG. 4C, second polysilicon layer 10 is anisotropic-etched using the patterned photoresist 11 as a mask, to form second and third transfer gates 10a and 10b which are superposed on both edges of first transfer gate 7 respectively and arranged on neighboring photodiodes 4 in parallel. A third interlevel oxide layer 12 is formed on second and third transfer gates 10a and 10b, and a third polysilicon layer 13 is formed thereon. A photoresist 14 is coated on third polysilicon layer 13, and patterned through exposure and development processes.

Referring to FIG. 4D, third polysilicon layer 13 and third interlevel oxide layer 12 are anisotropic-etched using the patterned photoresist as a mask, to form fourth transfer gate 13a which is placed on first transfer gate 7 between photodiodes 4 arranged in the row direction and superposed on first transfer gate 7, second transfer gate 10a and another transfer gate 10c of neighboring photodiode 4 in the VCCD region. The operation of the above conventional CCD is explained below. As shown in FIG. 3, fourth transfer gate 13a formed of third polysilicon layer 13, formed between photodiodes 4 in the row direction, is clocked, that is, single readout is carried out to fourth transfer gate 13a, when the charges accumulated in the photodiode are transferred to the VCCD, to thereby read-out the charges to the VCCD. Then, the charges, which have been moved to the VCCD, are transmitted to the HCCD according to clock timings TG1, TG2, TG3 and TG4 of first, second, third and fourth transfer gates. Here, it is difficult to transmit the charges stored in one photodiode 4 to the VCCD completely because second and third transfer gates 10a and 10b come into contact with neighboring photodiodes 4. Thus, only fourth transfer gate 13a is clocked when the charges are transmitted from photodiode 4 to the VCCD.

However, the aforementioned conventional CCD has the following problems. First of all, since the second and third transfer gates placed between the photodiodes in the row direction are superposed on one side of the first transfer gate, simultaneously, formed on the photodiode of the P-well, the capacitance between the polysilicon layers increases and their widths widen. Thus, the CCD is difficult to become smaller. Furthermore, only the fourth transfer gate formed of the third polysilicon layer is tri-level clocked when the signal charges are read-out. Accordingly, three-dimensional effect increases as the pixel size is reduced, obstructing complete readout.

SUMMARY OF THE INVENTION

Accordingly, the present invention is directed to a CCD and method of fabricating the same that substantially obviates one or more of the problems due to limitations and disadvantages of the related art.

An object of the present invention is to provide a CCD and method of fabricating the same, in which the fill factor of its pixel increases to improve the sensitivity, and signal charges are easily completely read-out at a low electrode voltage.

To accomplish the object of the present invention, there is provided a CCD having photodiodes in matrix form includes; a first interlevel insulating layer and first transfer gate sequentially formed between the photodiodes arranged in the row direction; a block insulating layer formed along the center of the first transfer gate; a second interlevel insulating layer formed on the first transfer gate; second and third transfer gates formed on the first transfer gate, being isolated from each other on the block insulating layer; a third interlevel insulating layer formed on the second and third transfer gates; and a fourth transfer gate formed on the third interlevel insulating layer, being placed on the second and third transfer gates.

A method of fabricating the CCD according to the present invention includes the steps of: forming a first interlevel insulating layer and first transfer gate between the photodiodes arranged in the row direction; forming a block insulating layer on the center of the first transfer gate; forming a second interlevel insulating layer on the first transfer gate; forming second and third transfer gates, to be superposed on the sides of the block insulating layer, isolated from each other on the block insulating layer and placed on the first transfer gate; forming a third interlevel insulating layer on the second and third transfer gates; and forming a fourth transfer gate on the second and third transfer gates.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

DETAILED DESCRIPTION OF PREFERRED EMBODIMENT

Reference will now be made in detail to the preferred embodiments of the present invention, examples of which are illustrated in the accompanying drawings.

Figure 1:
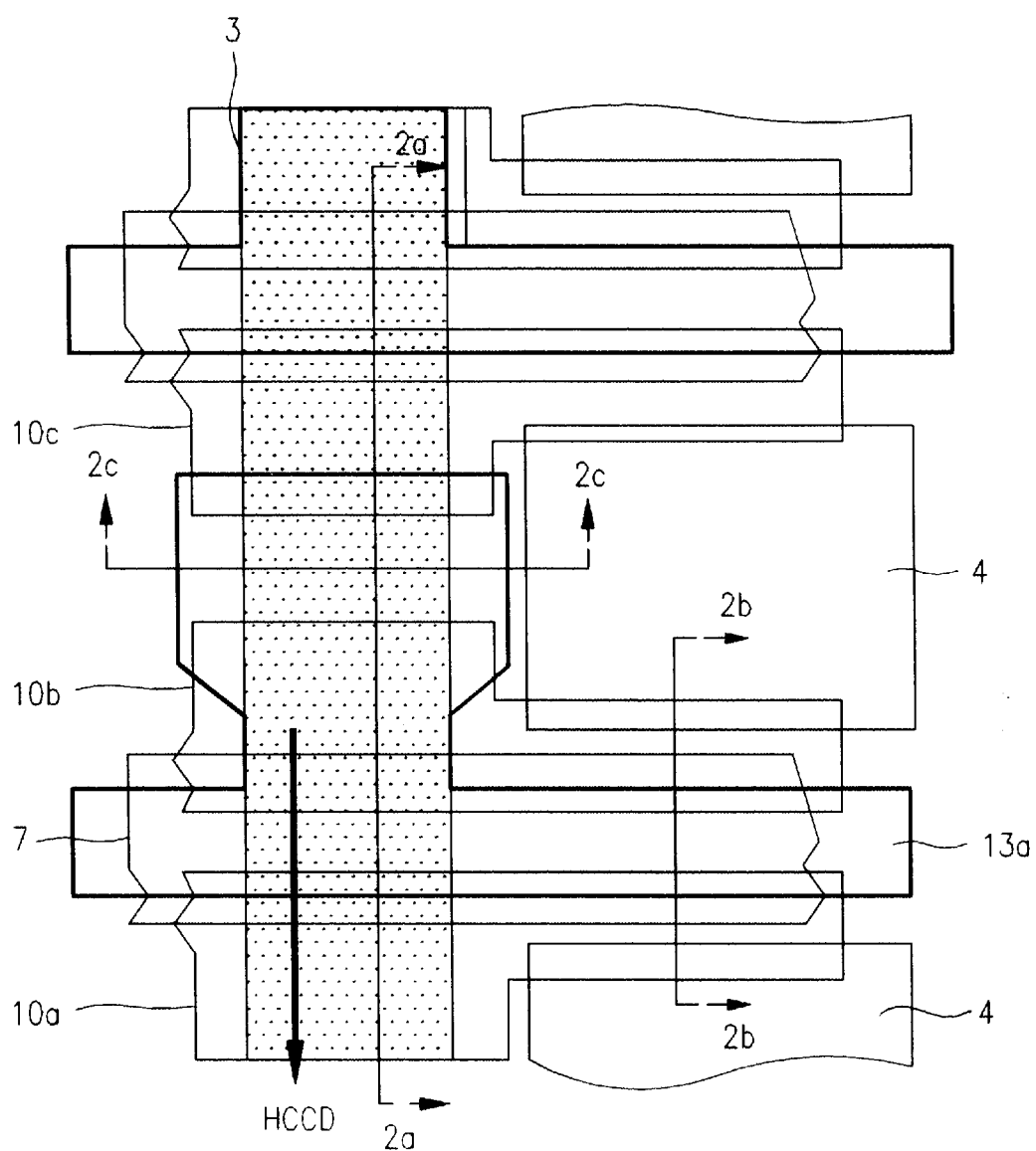
FIG. 1 is a plan view of a conventional 4-phase CCD formed using triple polysilicon layers.
Figure 2A:
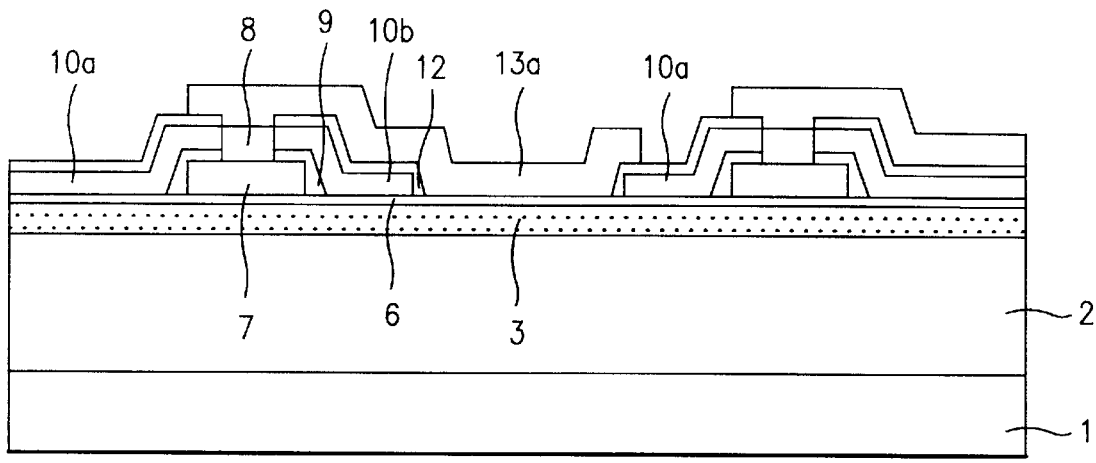
FIG. 2A is a cross-sectional view of the conventional CCD, taken along line I—I of FIG. 1.
Figure 2B:
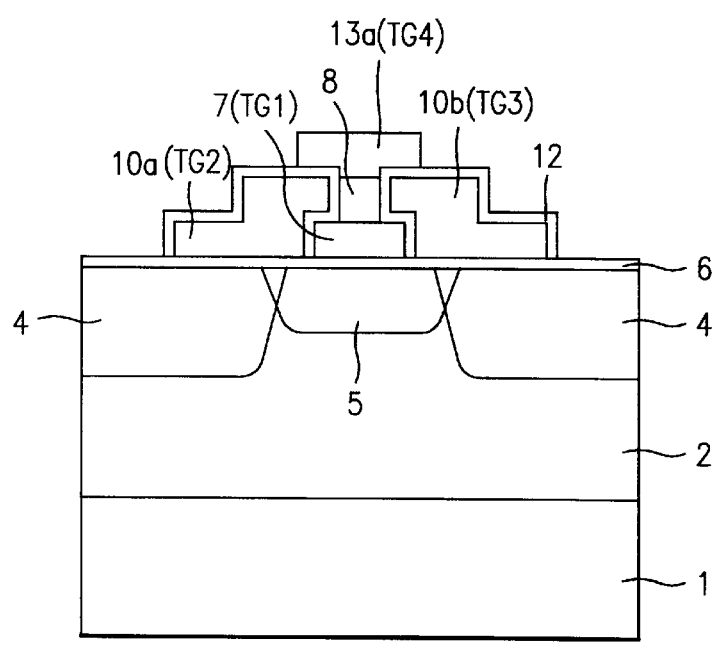
FIG. 2B is a cross-sectional view of the conventional CCD, taken along line II—II of FIG. 1.
Figure 2C:
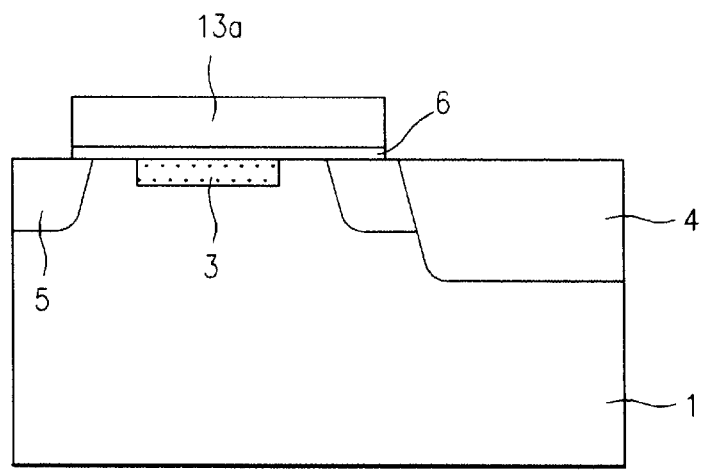
FIG. 2C is a cross-sectional view of the conventional CCD, taken along line III—III of FIG. 1.
Figure 3:
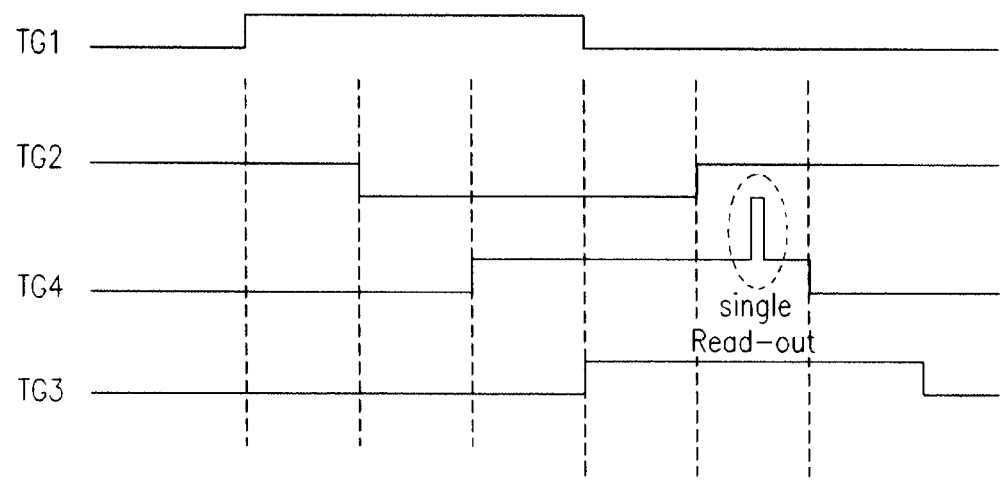
FIG. 3 show readout clocks of the conventional CCD.
Figure 4A:
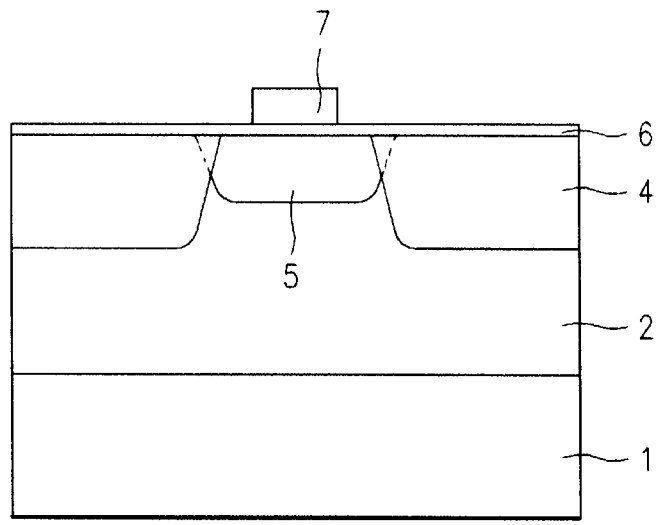
FIGS. 4A to 4D are cross-sectional views showing a method of fabricating the conventional CCD.
Figure 4B:
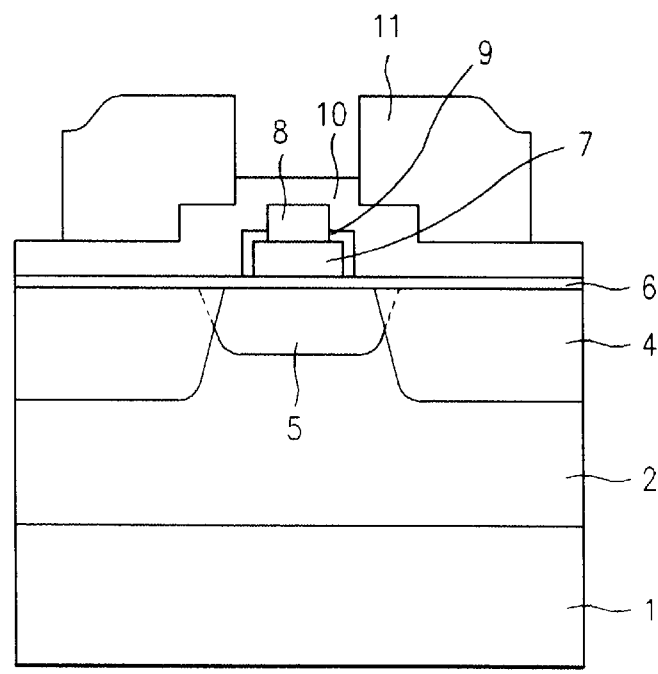
Figure 4C:
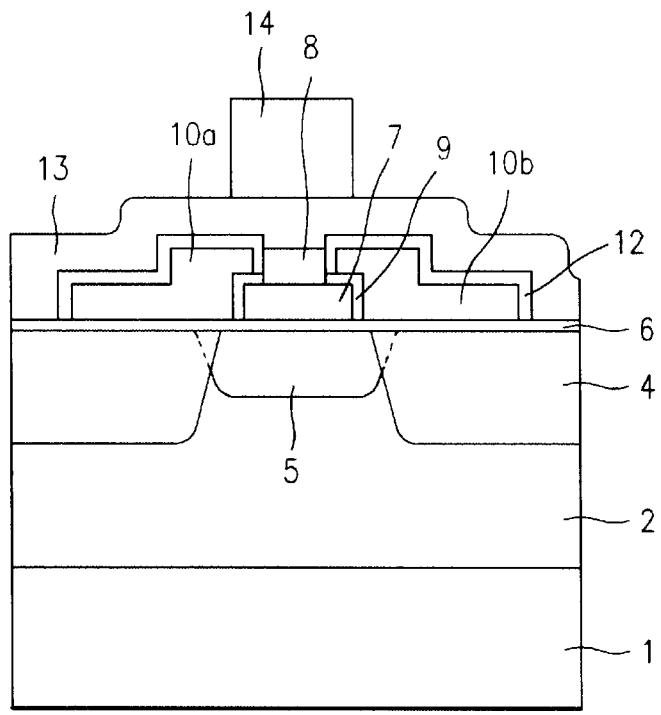
Figure 4D:
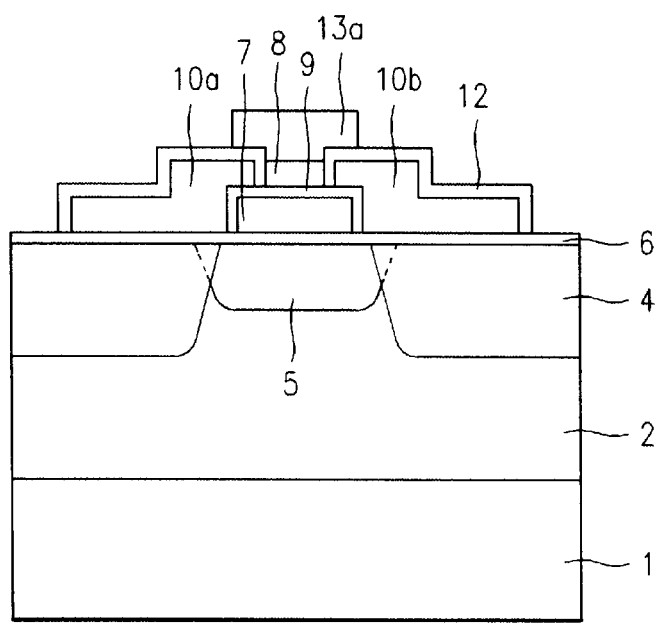
Figure 5:
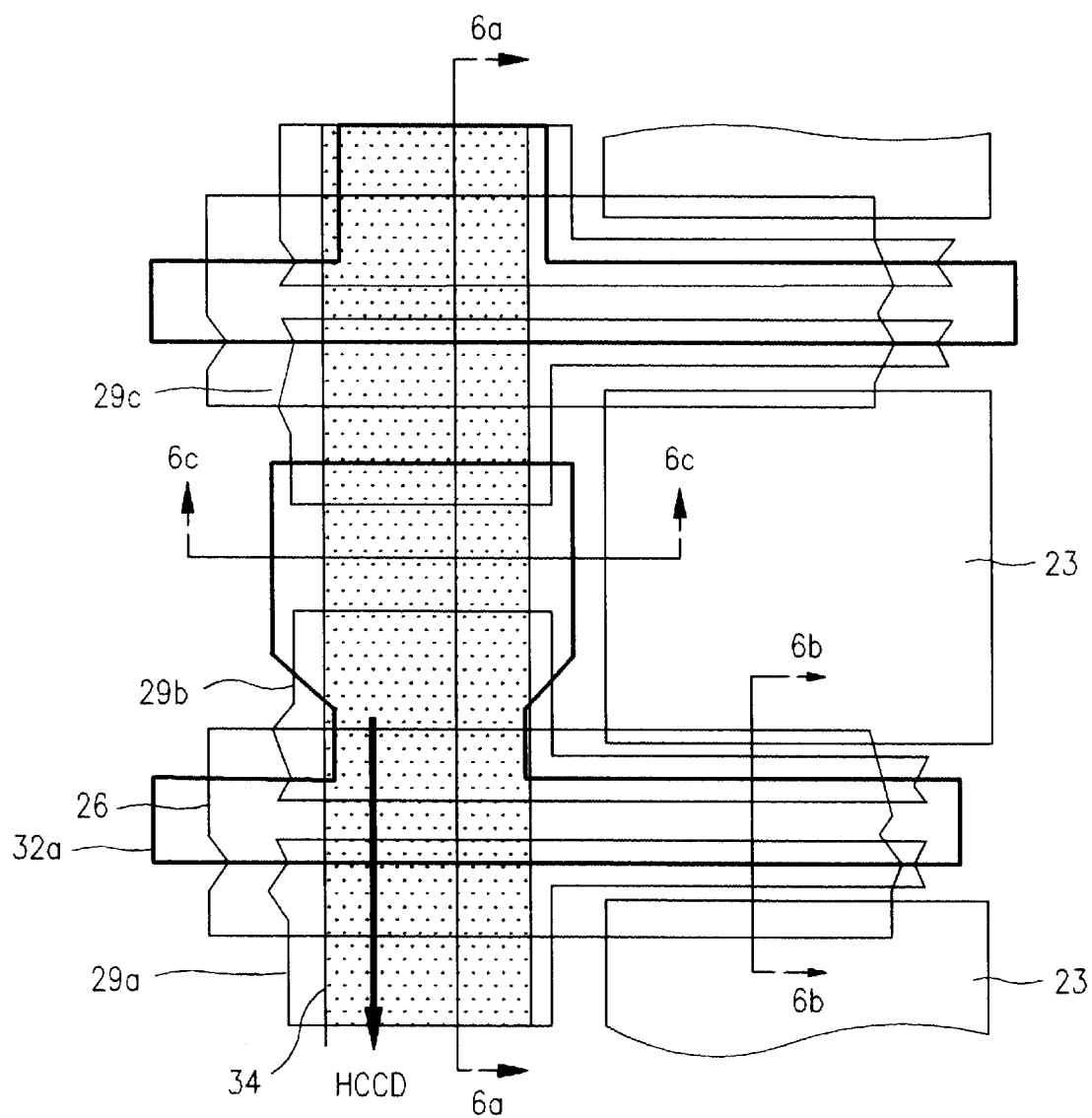
FIG. 5 is a plan view of a 4-phase CCD formed using triple polysilicon layers according to the present invention.
Figure 6A:
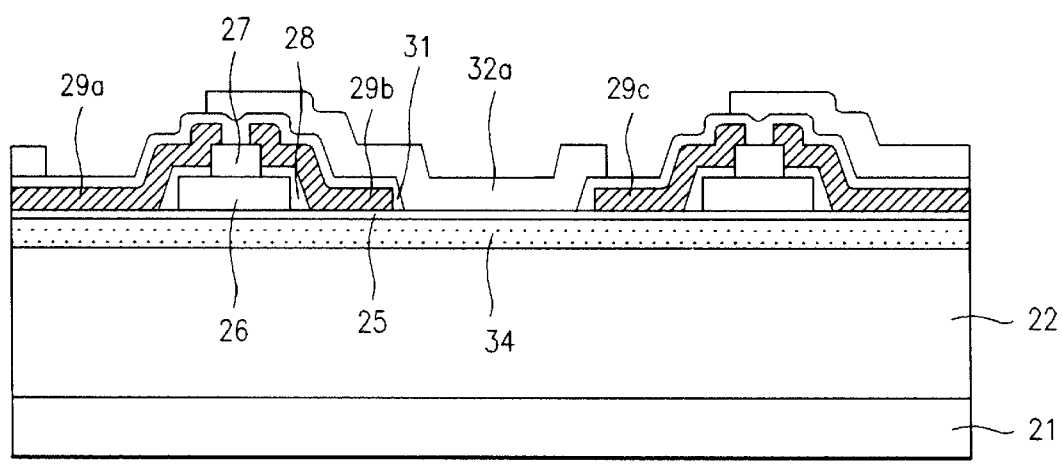
FIG. 6A is a cross-sectional view of the CCD according to the present invention, taken along line I—I of FIG. 5.
Figure 6B:
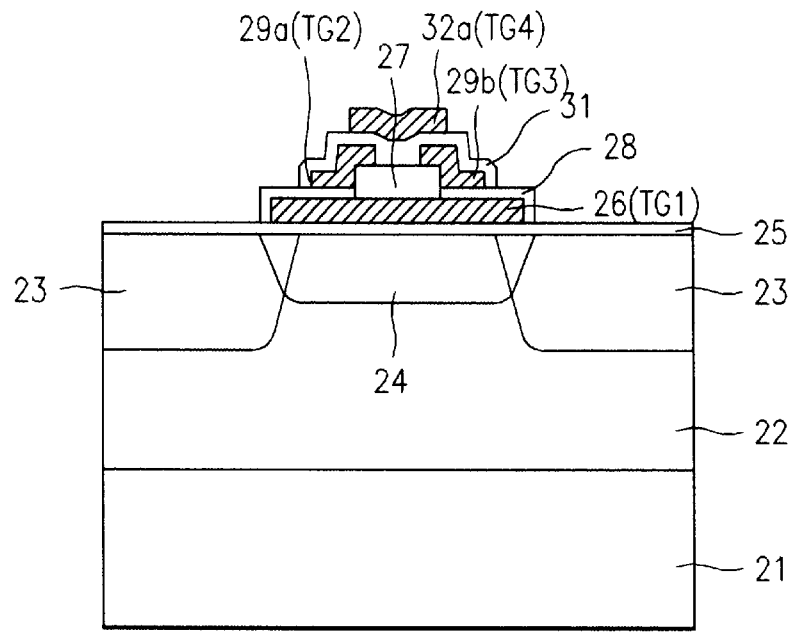
FIG. 6B is a cross-sectional view of the CCD according to the present invention, taken along line II—II of FIG. 5.
Figure 6C:
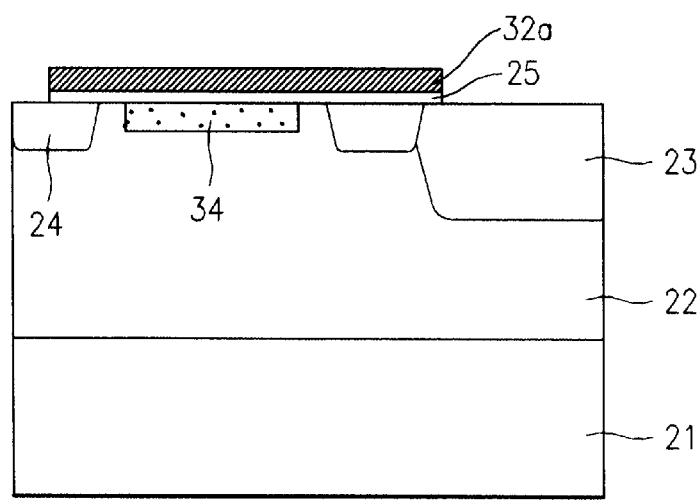
FIG. 6C is a cross-sectional view of the CCD according to the present invention, taken along line III—III of FIG. 5.
Figure 7:
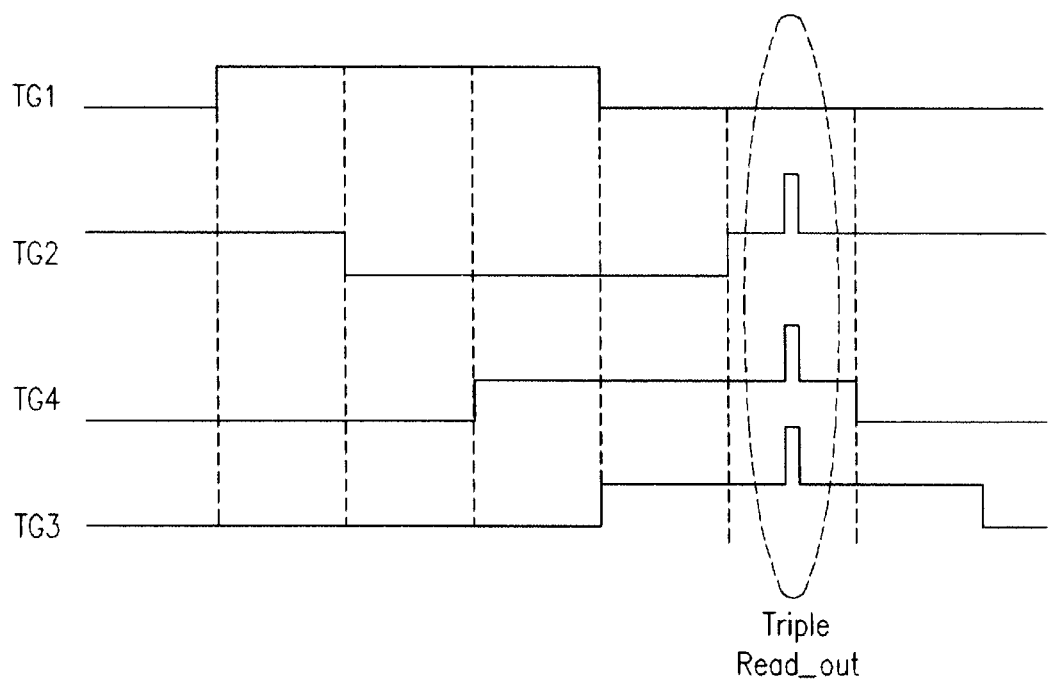
FIG. 7 show readout clocks of the CCD according to the present invention.

The present invention improves the structure of the 4-phase VCCD using triple polysilicon layers, which is being applied to quarter-inch three hundreds thirty thousands pixels of CCD, to thereby increase its sensitivity. FIG. 5 is a plan view of a 4-phase CCD formed using triple polysilicon layers according to the present invention, FIG. 6A is a cross-sectional view of the CCD according to the present invention, taken along line I—I of FIG. 5, FIG. 6B is a cross-sectional view of the CCD according to the present invention, taken along line II—II of FIG. 5, and FIG. 6C is a cross-sectional view of the CCD according to the present invention, taken along line III—III of FIG. 5. FIG. 7 show readout clocks of the CCD according to the present invention, and FIGS. 8A to 8D are cross-sectional views showing a method of fabricating the CCD according to the present invention.

Referring to FIGS. 5, 6A, 6B and 6C, the CCD of the present invention is constructed in such a manner that a P-well 22 is formed in an N-type semiconductor substrate 21 to a predetermined depth, and a BCCD 34 is formed in P-well 22 along the VCCD. A first interlevel oxide layer 25 and first transfer gate 26 formed of a first polysilicon layer are formed in one direction between photodiodes 23 in the row direction in the VCCD. A second interlevel oxide layer 28 is formed on first transfer gate 26, and a block oxide layer 27 having a predetermined height is formed on first transfer gate 26 in the direction of the first transfer gate 26. Second and third transfer gates 29a and 29b formed of a second polysilicon layer 29 are respectively superposed on both sides of block oxide layer 27, having a predetermined distance therebetween by block oxide layer 27.

Here, second and third transfer gates 29a and 29b are formed on first transfer gate 26 in the region between photodiodes 23 in the row direction, and they are opposite to each other in the VCCD region, having a predetermined distance therebetween at the center of first transfer gate 26. The widths of second and third transfer gates 29a and 29b can be reduced by controlling the height of block oxide layer 27. This is able to decrease the size of pixel. A third interlevel oxide layer 31 is formed on second and third transfer gates 29a and 29b, and a fourth transfer gate 34 is formed on second and third transfer gate 29a and 29b formed between photodiodes 23 in the row direction. Here, fourth transfer gate 34 is extended in the VCCD region, to be superposed on second transfer gate 29a, third transfer gate 29b and neighboring another second transfer gate 29c.

Figure 8A:
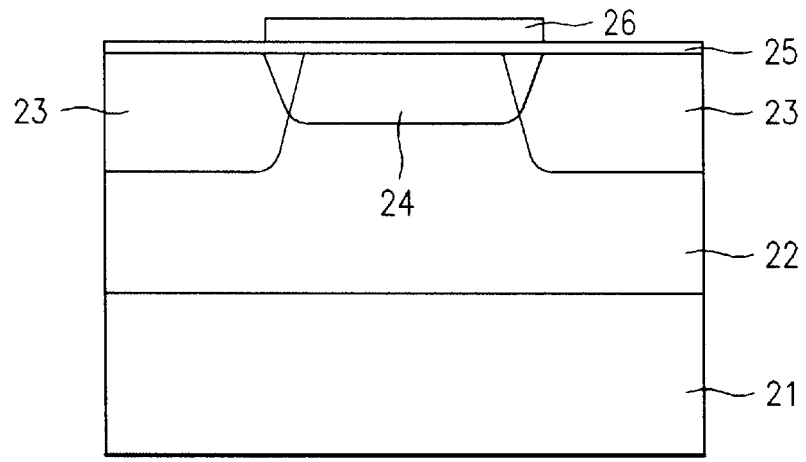
FIGS. 8A to 8D are cross-sectional views showing a method of fabricating the CCD according to the present invention.

A method of fabricating the above CCD of the present invention is explained below. Referring to FIG. 8A, P-type ions are implanted into N-type semiconductor substrate 21 and thermal diffusion is carried out, to form P-well 22 in semiconductor substrate 21 to a predetermined depth. A pattern for forming photodiodes is formed on P-well 22, and N-type impurity ions are implanted into P-well 22 to a predetermined depth, forming a plurality of photodiodes 23 in matrix form. Then, a P-type channel stop region 24 is formed in a portion of P-well 22, placed between photodiodes PD, so as to come into contact with one side of each of photodiodes 23 adjacent to each other in the row direction. A first interlevel oxide layer 25 is formed on the overall surface of the substrate thinly, and a first polysilicon layer is formed thereon. First polysilicon layer is anisotropic-etched to be left on channel stop region 24 placed between photodiodes 23 arranged in the row direction and on the VCCD region, forming first transfer gate 26.

Figure 8B:
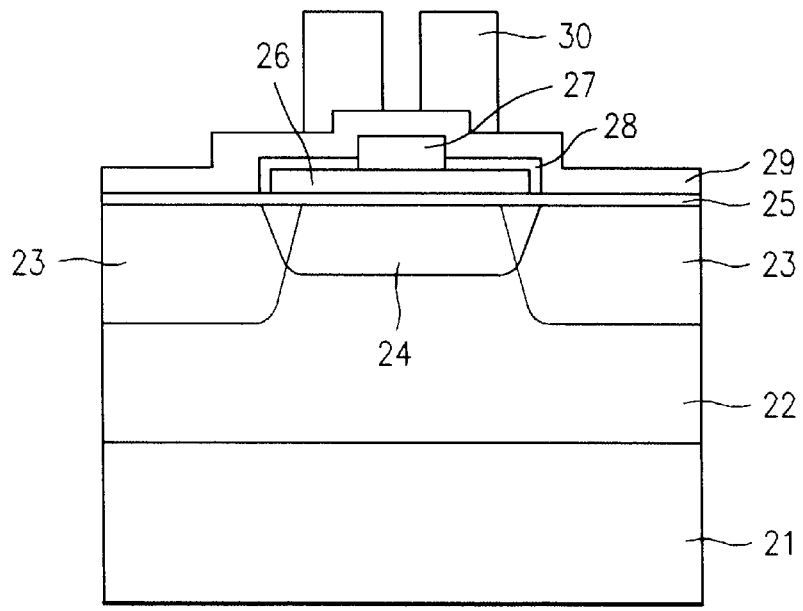
Figure 8C:
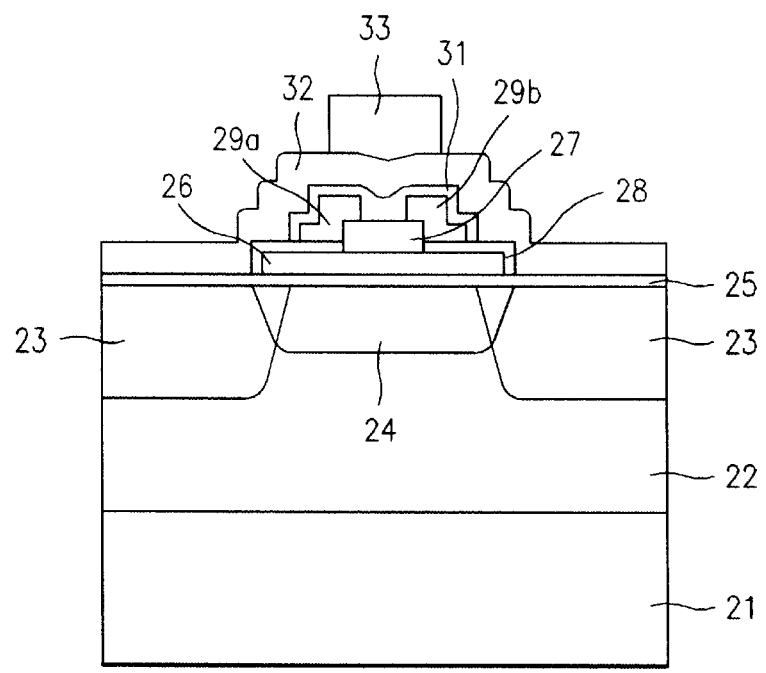

Referring to FIG. 8B, an oxide layer is deposited through CVD and anisotropic-etched, to be left on the center of first transfer gate 26, forming block oxide layer 27. A second interlevel oxide layer 28 and second polysilicon layer 29 are sequentially formed on first transfer gate 26. A photoresist 30 is coated on second polysilicon layer 29, and then selectively exposed and developed, to be patterned, exposing portions of second polysilicon layer 29, placed on the center of block oxide layer 27 and on both sides of first transfer gate 26. Referring to FIG. 8C, second polysilicon layer 29 is anisotropic-etched using the patterned photoresist 30 as a mask, to form second and third transfer gates 29a and 29b having a predetermined distance therebetween, which are superposed on both edges of first transfer gate 26 respectively. The areas of second and third transfer gates 29a and 29b can vary by controlling the height of block oxide layer 27. Here, second and third transfer gates 29a and 29b are formed on first transfer gate 26.

Figure 8D:
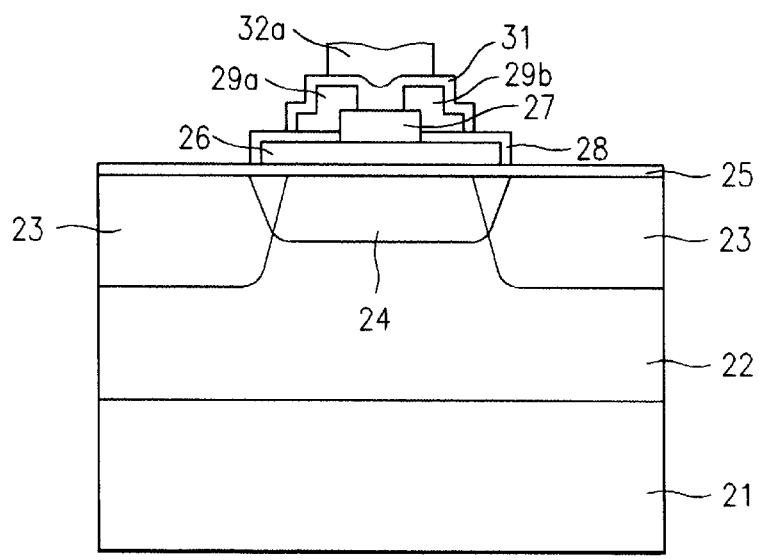

Thereafter, a third interlevel oxide layer 31 is formed on second transfer gate 29a, third transfer gate 29b and block oxide layer 27, and a third polysilicon layer 32 is formed thereon. A photoresist 33 is coated on third polysilicon layer 32, and patterned through exposure and development processes, to be selectively left on second and third transfer gates 29a and 29b. Referring to FIG. 8D, third polysilicon layer 32 is anisotropic-etched using the patterned photoresist 33 as a mask, forming fourth transfer gate 32a. Fourth transfer gate 32a is formed between second and third transfer gates 29a and 29b in the region between photodiodes 23 in the row direction, and partially superposed on third transfer gate 29b and neighboring another transfer gate 29c in the VCCD region. A fourth interlevel oxide layer 34 is formed on fourth transfer gate 32a through thermal oxidation.

The operation of the CCD of the present invention is described below. Second and third transfer gates 29a and 29b formed of second polysilicon layer 29 are placed on first transfer gate 26, fourth transfer gate 32a is placed on second and third transfer gates 29a and 29b. Accordingly, as shown in FIG. 7, second, third and fourth transfer gates TG2, TG3 and TG4 are simultaneously clocked, that is, triple readout is performed for the three transfer gates, when charges received by the photodiodes are read to the VCCD, to easily completely read-out the charges accumulated in the photodiodes to the VCCD. These charges, which have been moved to the VCCD, are transmitted to the HCCD according to the clock timings of first, second, fourth and third transfer gates TG1, TG2, TG3 and TG4.

The above-described CCD and method of fabricating the same according to the present invention have the following advantages. Firstly, the width of the second polysilicon layer can be reduced by increasing its vertical length using the block oxide layer, and thus it is possible to decrease the widths of the second, third and fourth transfer gates for triple readout, reducing the overlap capacitance between the first, second and third polysilicon layers. Secondly, when the signal charges accumulated in the photodiodes are read-out, the second, third and fourth transfer gates are turned on, to easily completely transmit the charges to the VCCD. Thirdly, the widths of the second and third transfer gates are reduced by controlling the height of the block oxide layer, to decrease the width of the transfer gate placed between the photodiodes, obtaining the small-size pixel. Fourthly, the fill factor of the pixel is increased, to improve the sensitivity. Fifth, the driving voltage for readout can be lowered than that in the conventional case because the three transfer gates can be simultaneously read-out in order to transmit the charges stored in the photodiodes to the VCCD.

It will be apparent to those skilled in the art that various modifications and variations can be made in the CCD and method of fabricating the same of the present invention without departing from the spirit or scope of the invention. Thus, it is intended that the present invention cover the modifications and variations of this invention provided they come within the scope of the appended claims and their equivalents.

What is claimed is:

1. A method of forming a charge coupled device, comprising:
    a) providing a substrate having at least two photodiodes formed therein;
    b) forming a first insulating layer on the substrate;
    c) forming a first transfer gate on a portion of the first insulating layer between the photodiodes;
    d) covering the first transfer gate with a second insulating layer having a projecting portion projecting up from the first transfer gate;
    e) forming second and third transfer gates over respective sides of the projecting portion of the second insulating layer and the first transfer gate, the second and third transfer gates having a gap therebetween over the projecting portion;
    f) covering each of the second and third transfer gates with a third insulating layer; and
    g) forming a fourth transfer gate over a portion of the second and third transfer gates and over the projecting portion of the second insulating layer.

2. The method of claim 1, wherein the step b) forms the first transfer gate on the portion of the first insulating layer between the photodiodes and over adjacent sides of the photodiodes.

3. The method of claim 2, wherein the step e) forms the second and third transfer gates such that the second and third transfer gates do not extend past sides of the first transfer gate adjacent to the photodiodes.

4. The method of claim 1, wherein the step e) forms the first and third transfer gates such that the second and third transfer gates do not extend past sides of the first transfer gate adjacent to the photodiodes.

5. The method of claim 1, wherein the step d) forms the second insulating layer such that the projecting portion has a block shape.

6. The method of claim 1, wherein the step d) forms the second insulating layer such that the projecting portion is disposed over a center portion of the first transfer gate.

7. The method of claim 1, wherein the step d) forms the second insulating layer such that the projecting portion has a width less than a width of the first transfer gate.

8. The method of claim 1, wherein the step d) forms the second insulating layer such that the projecting portion has a height and a width, and the height is less than the width.

9. The method of claim 1, wherein:
    the step a) provides the substrate having a plurality of photodiodes arranged in a matrix; and the steps b–g) form the first, second, third and fourth transfer gates and the second and third insulating layers between each pair of vertically adjacent photodiodes.

10. The method of claim 1, wherein the first, second, third and fourth transfer gates are formed of polysilicon.

11. A method of forming a charge coupled device, comprising:
   a) providing a substrate having at least two photodiodes formed therein;
   b) forming a first insulating layer on the substrate;
   c) forming a first transfer gate on a portion of the first insulating layer between the photodiodes and over adjacent sides of the photodiodes;
   d) covering the first transfer gate with a second insulating layer;
   e) forming second and third transfer gates over respective sides of the first transfer gate, the second and third transfer gates having a gap therebetween over the first transfer gate;
   f) covering each of the second and third transfer gates with a third insulating layer; and
   g) forming a fourth transfer gate over a portion of the second and third transfer gates.

12. A method of forming a charge coupled device, comprising:
   a) providing a substrate having at least two photodiodes formed therein;
   b) forming a first insulating layer on the substrate;
   c) forming a first transfer gate on a portion of the first insulating layer between the photodiodes;
   d) covering the first transfer gate with a second insulating layer;
   e) forming second and third transfer gates over respective sides of the first transfer gate such that the second and third transfer gates do not extend past the sides of the first transfer gate adjacent to the photodiodes, the second and third transfer gates having a gap therebetween over the first transfer gate;
   f) covering each of the second and third transfer gates with a third insulating layer;
   g) forming a fourth transfer gate over a portion of the second and third transfer gates.

13. A charge coupled device, comprising:
   at least two photodiodes formed in a substrate; and
   a transfer gate structure over the substrate including
      a first transfer gate formed over the substrate between the photodiodes;
      second and third transfer gates disposed over respective sides of the first transfer gate, wherein the second and third transfer gates do not overlap any portion of the photodiodes; and
      a fourth transfer gate formed over a portion of the second and third transfer gates.

14. The charge coupled device of claim 13, further comprising:
   a first insulating layer formed between the transfer gate structure and the substrate;
   a second insulating layer covering the first transfer gate; and
   a third insulating layer covering the second and third transfer gates.

15. The charge coupled device of claim 14, wherein the second and third transfer gates are formed such that a gap is formed therebetween above the first transfer gate.

* * * * *